US005633119A

United States Patent [19]

Burberry et al.

[11] Patent Number: 5,633,119

[45] Date of Patent: May 27, 1997

[54] LASER ABLATIVE IMAGING METHOD

[75] Inventors: Mitchell S. Burberry; Lee W. Tutt, both of Webster, N.Y.

[73] Assignee: Eastman Kodak Company, Rochester, N.Y.

[21] Appl. No.: 620,715

[22] Filed: Mar. 21, 1996

[51] Int. Cl.$^6$ .............................. G03C 1/73; G03F 7/12; G03F 7/36; G03F 7/40

[52] U.S. Cl. .............................. 430/292; 430/324; 430/330; 430/201; 430/964

[58] Field of Search .............................. 430/201, 200, 430/330, 292, 324, 964; 503/227

[56] References Cited

U.S. PATENT DOCUMENTS

| | | | |
|---|---|---|---|
| 5,360,781 | 11/1994 | Leenders et al. | 430/201 |
| 5,387,496 | 2/1995 | DeBoer | 430/201 |
| 5,429,909 | 7/1995 | Kaszczuk et al. | 430/273 |
| 5,459,017 | 10/1995 | Topel et al. | 430/201 |
| 5,506,086 | 4/1996 | Van Zoeren | 430/201 |

*Primary Examiner*—Richard L. Schilling
*Attorney, Agent, or Firm*—Harold E. Cole

[57] ABSTRACT

A process of forming a single color image comprising:

a) imagewise exposing, by means of a laser, a dye-ablative recording element comprising a support having thereon, in order, a hydrophilic dye-receiving layer and a hydrophobic dye-barrier layer, at least one of the dye-receiving layer and the dye-barrier layer having an infrared-absorbing material therein or in a layer therebetween to absorb at a given wavelength of the laser used to expose the element, thereby imagewise heating the dye-barrier layer and causing it to ablate;

b) removing the ablated dye-barrier layer material;

c) contacting the imagewise-exposed element with an aqueous ink solution; and d) drying the element to obtain a single color image in the ablative recording element.

7 Claims, No Drawings

LASER ABLATIVE IMAGING METHOD

CROSS REFERENCE TO RELATED APPLICATION

Reference is made to and priority claimed from U.S. Provisional Application Ser. No. US 60/001,450, filed 26 Jul. 1995, entitled LASER ABLATIVE IMAGING METHOD.

This invention relates to a process for obtaining a single color element for laser-induced, dye-ablation imaging and, more particularly, to a method for generating optical masks and monochrome transparencies used in graphic arts.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and leaves the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission Dmin density serves as a measure of the completeness of image dye removal by the laser. Examples of this type of ablative imaging is found in U.S. Pat. No. 5,429,909, the disclosure of which is hereby incorporated by reference.

There is a problem with this ablative printing method is that a relatively thick dye layer must be coated to achieve an acceptable Dmax in unprinted areas, and in Dmin areas almost all of this dye must be removed by the heat of the laser. This requires relatively high exposures and concomitant high power laser print heads. These requirements result in low throughput and high system costs. It would be desirable to provide an imaging method which eliminates these problems.

It is an object of this invention to provide a method of reducing the exposure needed to produce high contrast monocolor images.

This and other objects are achieved in accordance with the invention which relates to a process of forming a single color image comprising:

a) imagewise exposing, by means of a laser, a dye-ablative recording element comprising a support having thereon, in order, a hydrophilic dye-receiving layer and a hydrophobic dye-barrier layer, at least one of the dye-receiving layer and the dye-barrier layer having an infrared-absorbing material therein or in a layer therebetween to absorb at a given wavelength of the laser used to expose the element, thereby imagewise heating the dye-barrier layer and causing it to ablate;

b) removing the ablated dye-barrier layer material;

c) contacting the imagewise-exposed element with an aqueous ink solution; and d) drying the element to obtain a single color image in the ablative recording element.

In a preferred embodiment of the invention, the infrared-absorbing material is a dye which is located in the dye-barrier layer.

In the process of the invention, the dye-ablative recording element is exposed by a laser which causes the hydrophobic dye-barrier layer to be ablated, melted, pushed aside, or otherwise removed by laser heating, thereby uncovering the underlying hydrophilic dye-receiving layer. When the exposed element is brought into contact with an aqueous ink solution, the dye-receiving layer soaks up imaging dye from the solution preferentially in the exposed regions, thus providing a contrast difference between exposed and unexposed areas.

The advantage of this invention is that high-contrast, monocolor images can be achieved with a low exposure to produce a negative-working image system. A negative-working system has an advantage when used in conjunction with another negative-working imaging material (such as when used as a mask for making printing plates or contact duplicates). In this case the background need not be exposed, thus saving time and energy for many images.

The hydrophobic dye-barrier layer employed in the invention can be made relatively thin since it does not contain image dyes and, therefore, requires little energy to be removed. This is in contrast to a thick dye layer used in conventional ablation films which requires more energy to be removed. For example, the dye-barrier layer can be from about 0.01 μm to about 5 μm in thickness, preferably from about 0.05 μm to about 1 μm.

The contrast between exposed and unexposed areas in the element can be controlled by variables, such as, laser exposure, time of contact with the ink solution, concentration of the ink solution, thickness of the dye-receiving layer, and diffusion properties of the dye within the dye-receiving layer.

The process of the invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

To obtain a laser-induced, ablative image using the process of the invention, a diode laser is preferably employed since it offers substantial advantages in terms of its small size, low cost, stability, reliability, ruggedness, and ease of modulation. In practice, before any laser can be used to heat an ablative recording element, the element must contain an infrared-absorbing material, such as pigments like carbon black, or cyanine infrared-absorbing dyes as described in U.S. Pat. No. 4,973,572, or other materials as described in the following U.S. Pat. Nos.: 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye-barrier layer and converted to heat by a molecular process known as internal conversion. As noted above, the infrared-absorbing material or dye may be contained in the dye-barrier layer, the dye-receiving layer or in a layer therebetween.

Lasers which can be used in the invention are available commercially. There can be employed, for example, Laser Model SDL-2420-H2 from Spectra Diode Labs, or Laser Model SLD 304 V/W from Sony Corp.

The dyes in the aqueous ink solution which can be used in the process of the invention can be any water-soluble dye known in the art, such as, for example, nigrosin black, crystal violet, azure c, azure a, acid red 103, basic orange 21, acriflavine, acid red 88, acid red 4, direct yellow 62, direct yellow 29, basic blue 16, lacmoid, litmus, saffron, rhodamine The above dyes are available from Aldrich Chemical Co.

The aqueous ink solution may be applied to the recording element by either bathing the element in a solution of the dye or applying the dye by a sponge, squeegee, roller or other applicator.

The hydrophobic dye-barrier layer material used in the invention can be, for example, nitrocellulose, cellulose acetate propionate, cellulose acetate, polymethylmethacrylate, polyacrylates, polystyrenes, polysulfones, polycyanoacrylates, etc. There can be included in this layer, for example, ablation enhancers such as blowing agents, azides, accelerators, e.g., 4,4'-diazidobenzophenone and 2,6-di(4-azidobenzal)-4-methylcyclohexanone, or the materials disclosed in U.S. Pat. No. 5,256,506.

The hydrophilic dye-receiving layer used in the process of the invention is a water-insoluble polymer such as a high molecular weight and/or crosslinked polymer, e.g., a high molecular weight and/or crosslinked gelatin, xanthum gum (available commercially as Keltrol T® from Kelco-Merck Co.), poly(vinyl alcohol), polyester ionomers, polyglycols, polyacrylamides, polyalkylidene-etherglycols, polyacrylates with amine, hydroxyl or carboxyl side groups, etc.

Any material can be used as the support for the ablative recording element employed in the process of the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLE 1

The structural formulas of the materials referred to below are:

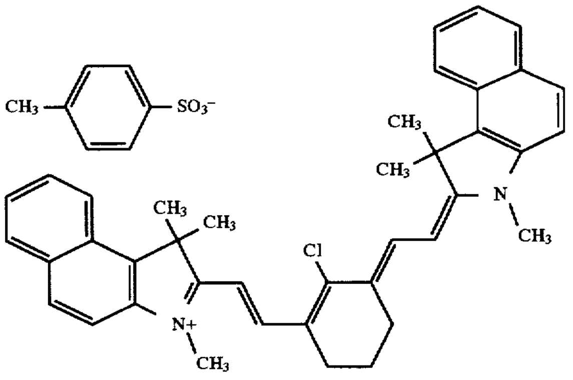

Infrared-Absorbing Dye IR-1

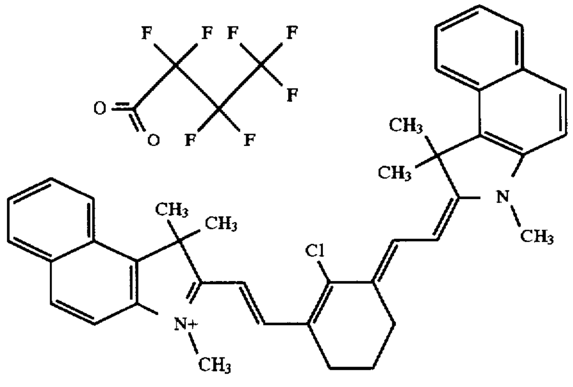

Infrared-Absorbing Dye IR-2

Dye-Receiving Layer

Aqueous coatings were prepared by dissolving Keltrol T®, gelatin or AQ-38 (a sulfonated polyester from Eastman Chemical Co.) in water, knife-coating the solution on 100 μm (poly(ethylene terephthalate) support and drying to produce a dried coating containing 1.08 $g/m^2$ of polymer.

Dye-Barrier Layer

A solvent coating was prepared by dissolving solvent-compatible polymers identified below and IR-absorbing dye in acetone and knife-coating the solution over the above-described dye-receiving layer on a support to produce a dried layer containing a weight of solid material as follows:

Examples 1 through 4: 0.108 g/m$^2$ nitrocellulose (NC) and 0.054 g/m$^2$ IR-1.

Examples 5 through 7: 0.0864 g/m$^2$ of cellulose acetate propionate (CAP), 20 sec. viscosity (Eastman Chemical Co.) and 0.0324 g/m$^2$ IR-2.

The samples were exposed using Spectra Diode Labs Lasers Model SDL-2432, having an integral, attached fiber for the output of the laser beam with a wavelength range of 800–830 nm and a nominal power output of 250 mW at the end of the optical fiber. The cleaved face of the optical fiber was imaged onto the plane of the element with a 0.5 magnification lens assembly mounted on a translation stage giving a nominal spot size of 25 μm. The drum, 53 cm in circumference, was rotated at varying speeds (see Tables 1 and 2) and the imaging electronics were activated to provide the exposures listed in Table 2. The translation stage was incrementally advanced across the film element by means of a lead screw turned by a microstepping motor, to give a center-to-center line distance of 10 μm (945 lines per cm, or 2400 lines per in.). An air stream was blown over the donor surface to remove the ablated material. The measured total power at the focal point was 100 mW.

Ink Development: Two aqueous ink solutions were prepared as follows.

Solution 1: approximately one gram of crystal violet (Aldrich Co.) was dissolved in 500 ml of water.

Solution 2: approximately one gram of nigrosin black (Aldrich Co.) was dissolved in 500 ml of water.

After exposure the films were submerged in an ink solution (see Table 1) for approximately 5 seconds, rinsed with water and allowed to air dry. Status A Green density was measured for each exposure level using an X-Rite Model 310 densitometer with the following results:

TABLE 1

| Sample | Dye-Receiver Layer | Dye-Barrier Layer | Ink | D min | D max* |
|---|---|---|---|---|---|
| 1 | Keltrol T® | NC + IR- 1 | Crystal Violet | 0.085 | 0.935 |
| 2 | Keltrol T® | NC + IR - 2 | Crystal Violet | 0.087 | 1.02 |
| 3 | Keltrol T® | NC + IR - 1 | Nigrosin Black | 0.126 | 0.459 |
| 4 | Keltrol T® | NC + IR - 2 | Nigrosin Black | 0.134 | 0.479 |
| 5 | Gelatin | CAP + IR - 1 | Crystal Violet | 0.141 | 1.849 |
| 6 | Keltrol T® | CAP + IR - 1 | Crystal Violet | 0.078 | 0.729 |
| 7 | AQ-38 | CAP + IR - 1 | Crystal Violet | 0.067 | 0.179 |

*All samples run at 300 rev/min except for samples 3 and 4 which were run at 600 rev/min.

The above results show that good contrast can be achieved using a variety of hydrophilic receiver polymers, hydrophobic overcoat polymers, IR absorber dyes and ink formulations in accordance with this invention. Crystal violet produces a deep violet image in the exposed areas whereas nigrosin black produces a good neutral black color.

TABLE 2

| Drum Speed (rev/min) | Exposure (mJ/cm$^2$) | Status A Green Density |
|---|---|---|
| 150 | 713 | 1.113 |
| 200 | 534 | 1.011 |
| 300 | 357 | 0.935 |
| 400 | 267 | 0.773 |
| 600 | 178 | 0.594 |
| — | 0 | 0.085 |

The above results shows that the density achieved is relatively insensitive to exposure up to above 300 mJ/cm$^2$.

The invention has been described in detail with particular reference to preferred embodiments thereof, but it will be understood that variations and modifications can be effected within the spirit and scope of the invention.

What is claimed is:

1. A process of forming a single color image comprising:

a) imagewise exposing, by means of a laser, a dye-ablative recording element comprising a support having thereon, in order, a hydrophilic dye-receiving layer and a hydrophobic dye-barrier layer, at least one of said dye-receiving layer and said dye-barrier layer having an infrared-absorbing material therein or in a layer therebetween to absorb at a given wavelength of said laser used to expose said element, thereby imagewise heating said dye-barrier layer and causing it to ablate;

b) removing the ablated dye-barrier layer material;

c) contacting said imagewise-exposed element with an aqueous ink solution; and d) drying said element to obtain a single color image in said ablative recording element.

2. The process of claim 1 wherein said infrared-absorbing material is a dye which is contained in said dye-barrier layer.

3. The process of claim 1 wherein said support is transparent.

4. The process of claim 1 wherein said dye-receiving layer is gelatin.

5. The process of claim 1 wherein said dye-receiving layer is xanthum gum.

6. The process of claim 1 wherein said dye-barrier layer is cellulose acetate propionate.

7. The process of claim 1 wherein said dye-barrier layer is nitrocellulose.

* * * * *

UNITED STATES PATENT AND TRADEMARK OFFICE

CERTIFICATE OF CORRECTION

PATENT NO. : 5,633,119

DATED : May 27, 1997

INVENTOR(S) : Mitchell S. Burberry and Lee W. Tutt

It is certified that error appears in the above-indentified patent and that said Letters Patent is hereby corrected as shown below:

On the title page, after item [22], insert --Related U.S. Application Data [63] Provisional Application Serial No. 60/001,450, filed July 26, 1995.--

Signed and Sealed this

Nineteenth Day of August, 1997

Attest:

Bruce Lehman

BRUCE LEHMAN

*Attesting Officer* *Commissioner of Patents and Trademarks*